United States Patent [19]

Iranmanesh

[11] Patent Number: 5,107,320

[45] Date of Patent: Apr. 21, 1992

[54] METHOD AND APPARATUS FOR IMPROVEMENT OF INTERCONNECTION CAPACITANCE

[75] Inventor: Ali A. Iranmanesh, Federal Way, Wash.

[73] Assignee: National Semiconductor Corporation, Santa Clara, Calif.

[21] Appl. No.: 649,169

[22] Filed: Feb. 1, 1991

Related U.S. Application Data

[63] Continuation of Ser. No. 391,344, Aug. 9, 1989, abandoned.

[51] Int. Cl.$^5$ ............... H01L 29/72; H01L 29/34
[52] U.S. Cl. ............................. 357/34; 357/52
[58] Field of Search ................. 357/34, 35, 52

[56] References Cited

U.S. PATENT DOCUMENTS

| | | | |
|---|---|---|---|
| 4,319,932 | 3/1982 | Jambotkar | 148/1.5 |
| 4,507,847 | 4/1985 | Sullivan | 29/576 |
| 4,520,448 | 5/1985 | Tremintin | 364/488 |
| 4,535,531 | 8/1985 | Bhatia et al. | 29/577 C |
| 4,609,568 | 9/1986 | Koh et al. | 427/85 |
| 4,661,832 | 4/1987 | Lechaton et al. | 357/49 |
| 4,754,313 | 6/1988 | Takemae | 357/41 |
| 4,764,480 | 8/1988 | Vora | 437/54 |
| 4,860,085 | 8/1989 | Feygenson | 357/59 |

FOREIGN PATENT DOCUMENTS

| | | | |
|---|---|---|---|
| 0220500 | 5/1987 | European Pat. Off. | 357/43 |
| 61-207065 | 9/1986 | Japan | 357/34 |
| 62-069656 | 3/1987 | Japan | 357/34 |

OTHER PUBLICATIONS

Sze, *VLSI Technology*, International Student Edition, 1983, pp. 482–485, McGraw Hill, Singapore.
Muller et al., "Device Electronics for Integrated Circuits," Chapter 8, pp. 378–421, John Wiley & Sons, Inc., 1986.
Lee et al., "A Selective CVD Tungsten Local Interconnect Technology," *IEDM* (1988), pp. 450–453.
Sakurai et al., "Simple Formulas for Two- and Three-Dimensional Capacitances," *IEEE Transactions on Electron Devices* (1983), ED-30:183 –185.
Copy of U.S. application Ser. No. 079,626, filed Jul. 29, 1987.

*Primary Examiner*—Andrew J. James
*Assistant Examiner*—Stephen D. Meier
*Attorney, Agent, or Firm*—Townsend and Townsend

[57] ABSTRACT

A method and apparatus for reducing interconnection capacitance. A lightly doped buried layer is provided in or on a substrate below a field oxide region. The capacitance of an interconnect on the field oxide is significantly reduced by the lightly doped buried layer. When using a p-type substrate, the lightly doped buried layer may, for example, be a lightly doped ($10^{13}$/cm$^3$) n-type region. Junction capacitance of, for example, a bipolar transistor is also reduced.

15 Claims, 4 Drawing Sheets

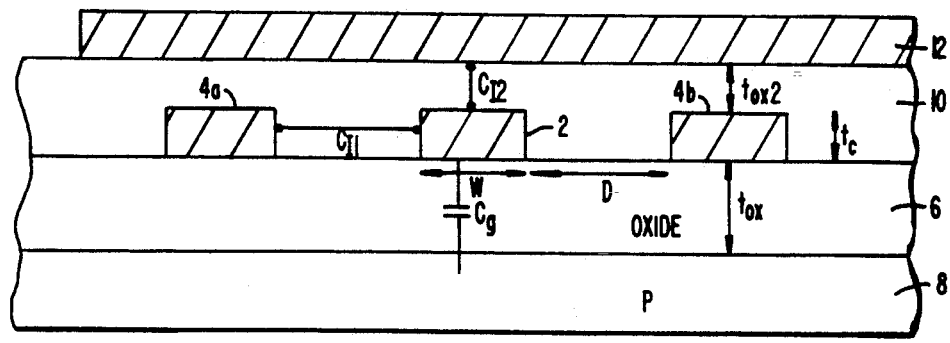
FIG._1.
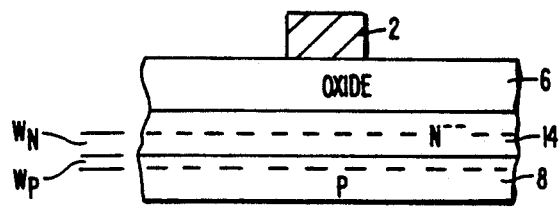
FIG._2.
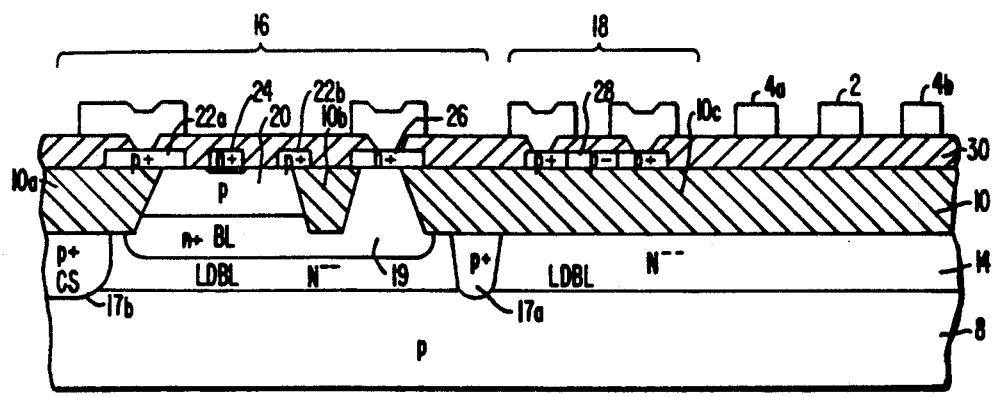
FIG._3.

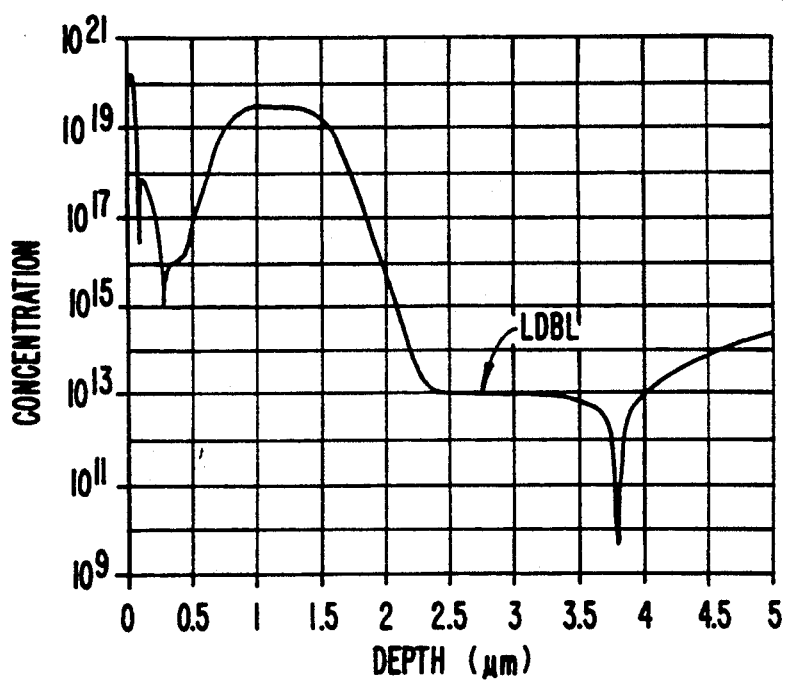
FIG._4.
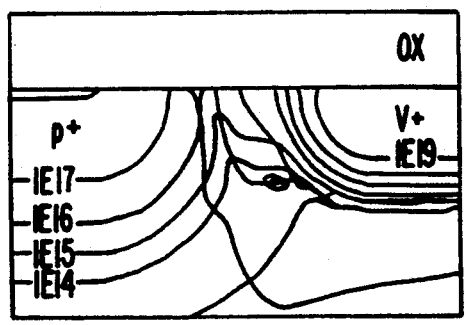
FIG._5.

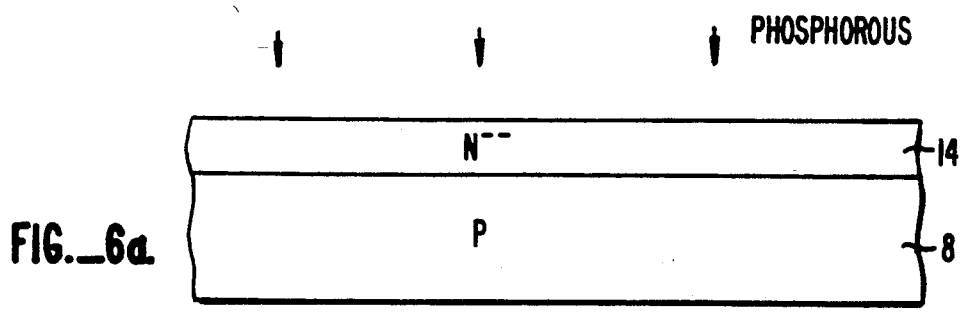
FIG._6a.
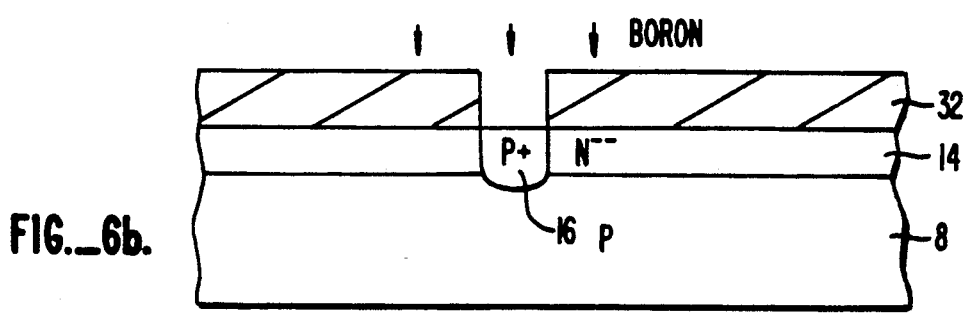
FIG._6b.
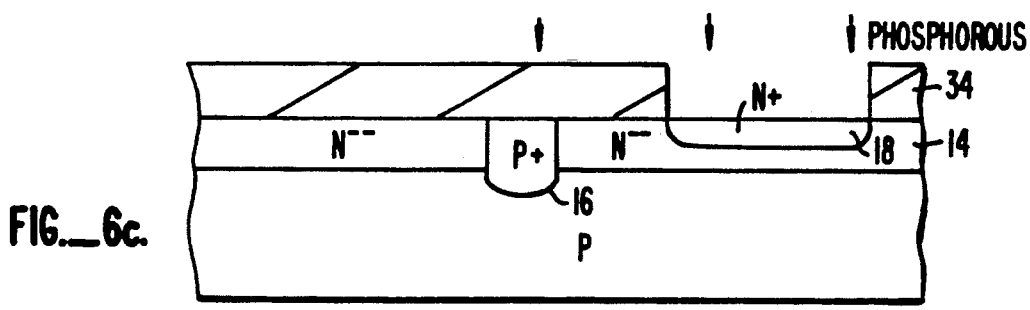
FIG._6c.
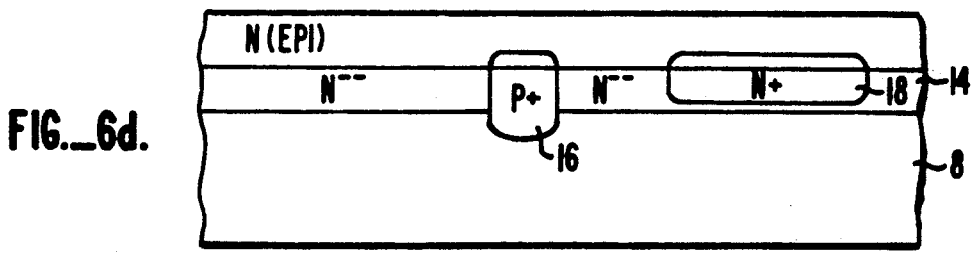
FIG._6d.

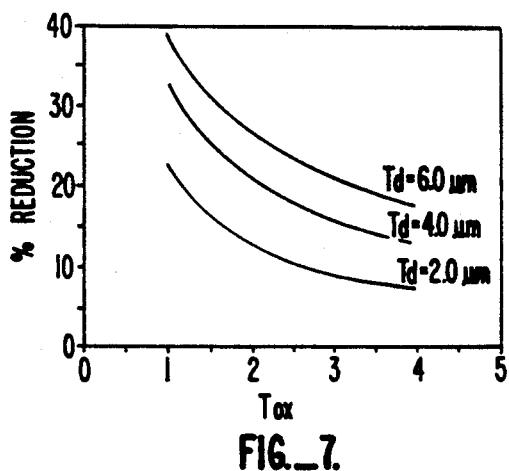
FIG._7.
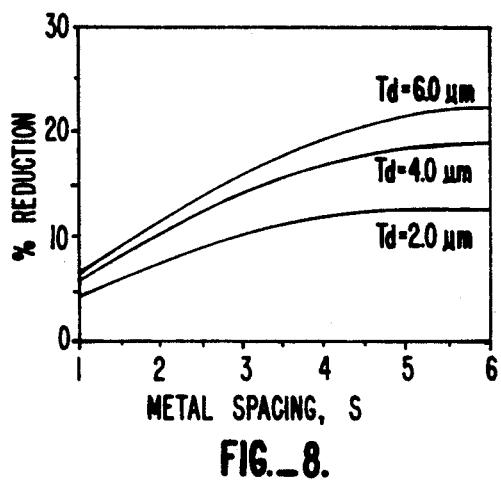
FIG._8.
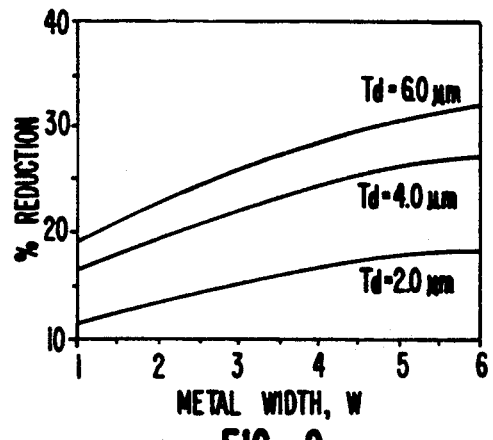
FIG._9.
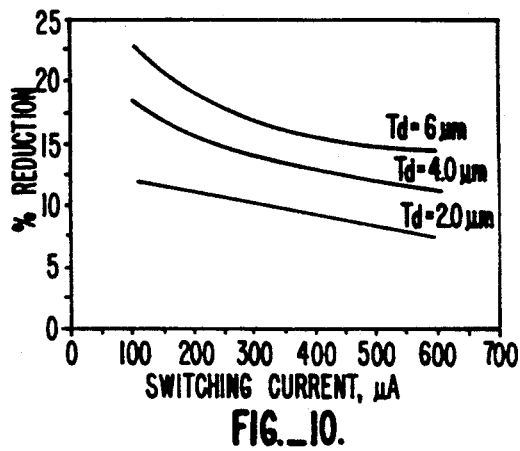
FIG._10.
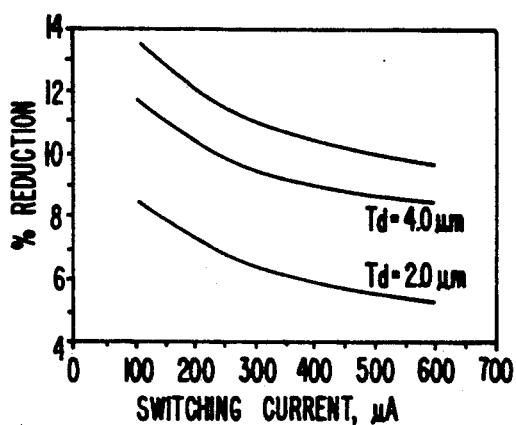
FIG._11.

METHOD AND APPARATUS FOR IMPROVEMENT OF INTERCONNECTION CAPACITANCE

This is a continuation Ser. No. 391,344 filed Aug. 9, 1989.

BACKGROUND OF THE INVENTION

The present invention relates to the field of semiconductor devices, their use, and manufacture. More particularly, in one embodiment the present invention provides an improved method and structure for reducing or improving substrate and interconnection capacitance in a semiconductor device.

Semiconductor devices are presently characterized by very small intrinsic delays as a consequence of a wide variety of improvements in their architecture, processing, and use. Self alignment techniques, improvements in lithography techniques, and improvements in dry etching techniques are exemplary of the changes which have resulted in devices having small intrinsic delays.

As semiconductor devices and their fabrication techniques have improved, the capacitance associated with interconnection lines plays an increasingly dominant role in the speed performance of an integrated circuit. An interconnect in an integrated circuit may include, for example, a metal or polysilicon layer deposited on a field oxide region. The field oxide region serves to create a high threshold voltage for a parasitic metal-insulator-silicon (MIS) device formed by the interconnection, the oxide, and the substrate. A heavily doped region below the oxide may be provided for better device isolation between, for example, adjacent bipolar transistors.

It is well known that device performance is impacted by the capacitance between the interconnect and the underlying substrate. Proposed solutions to the problems of interconnection capacitance include increasing the thickness of the field oxide used for isolation between devices, increasing substrate resistivity, and the like.

While meeting with some success, some prior solutions result in insufficient reductions in interconnect capacitance, particularly when applied to very small devices. Other solutions are uneconomical or create unacceptable complexities in the fabrication process. For example, significant increases in dielectric thickness may result in unacceptable encroachment, high defect density, or unacceptable topology in some devices. In spite of attempts to reduce interconnect capacitance, interconnect capacitance plays an increasingly significant role in device performance. Accordingly, an improved method of decreasing interconnect capacitance is needed.

SUMMARY OF THE INVENTION

An improved process and apparatus for reducing interconnect to substrate capacitance is disclosed. In one embodiment the invention provides for the use of a lightly doped buried layer between an interconnection and the substrate. As used herein, an "interconnection" includes, for example, local interconnects, wiring leads, and/or their associated bonding pads. The lightly doped buried layer is preferably of opposite conductivity type from the substrate and creates a p-n junction having a large depletion region between the field oxide and the substrate. This p-n junction creates an additional capacitance in series with the capacitance provided by the oxide.

In some embodiments the invention provides a 5-50% or greater decrease in interconnect-to-substrate capacitance. The invention also provides for reduced collector to substrate junction capacitance in bipolar transistors and improved tub-to-substrate capacitance in MOS capacitors and transistors.

Accordingly, in one embodiment the invention comprises a substrate having a major surface, the substrate having a first conductivity type; a lightly doped region at the major surface; a dielectric region adjacent the lightly doped region and opposite the substrate; and a conductive region on the dielectric region, the conductive region connecting a first device and a second region on the substrate. The lightly doped region, in preferred embodiments, is of an opposite conductivity type.

In an alternative embodiment the semiconductor structure provided by the invention comprises or consists essentially of at least a first device and a second device on a substrate, the substrate being of a first conductivity type; a field oxide region between the first and the second device; an interconnection between the first and the second device on the field oxide region; and a lightly doped region on the substrate between the field oxide region and the substrate. The lightly doped region is preferably doped to provide a net dopant concentration of less than about $10^{15}/cm^3$ and most preferably between about $10^{12}$ and $10^{14}/cm^3$. In most preferred embodiments, the lightly doped region is doped to a concentration of about $10^{13}/cm^3$. In alternative embodiments the lightly doped region is doped to a concentration of at least about one order of magnitude less than the substrate and preferably between two and four orders of magnitude less than the substrate.

A process of forming a semiconductor structure is also disclosed, as well as its resulting structure. In one embodiment a structure is formed by the process of providing a substrate having a major surface, the substrate having a first conductivity type; on the major surface, providing a lightly doped region; on the lightly doped region, providing a field oxide region; and on the field oxide region, providing a conductive material, the conductive material connecting a first and a second device formed on the substrate.

BRIEF DESCRIPTION OF THE DRAWINGS

FIG. 1 is a detailed view of an interconnect which illustrates the components which contribute to the capacitance of the interconnect;

FIG. 2 is a cross-section of a semiconductor interconnect structure according to one embodiment of the invention;

FIG. 3 is a cross-section of a bipolar transistor and a resistor in an integrated circuit according to one embodiment of the invention;

FIG. 4 is a sample concentration profile for the device shown in FIG. 3;

FIG. 5 is a dopant profile used to estimate the effect of an LDBL on the periphery component of $C_{js}$;

FIGS. 6a to 6d illustrate one possible process for forming a structure according to the invention;

FIG. 7 illustrates the reduction in capacitance achieved according to one embodiment of the invention as a function of oxide thickness and LDBL thickness;

FIG. 8 illustrates reduction in capacitance for a 3-lead device as a function of metal spacing and LDBL thickness;

FIG. 9 illustrates capacitance as a function of lead width and LDBL thickness;

FIG. 10 illustrates the reduction in switching time versus switching current and LDBL thickness for a single lead; and FIG. 11 illustrates the reduction in switching time versus switching current and LDBL thickness for a 3-lead device.

DETAILED DESCRIPTION OF THE PREFERRED EMBODIMENTS

Contents

I. General
II. Application to a Bipolar Device
III. Process Flow
IV. Example 1
V. Example 2
VI. Example 3
VII. Application to a MIS Device

I. General

FIG. 1 illustrates the capacitance components of a typical interconnection 2. Interconnect 2 may act as an interconnect between, for example, bipolar transistors, MIS transistors, p-n diodes, Schottky diodes, resistors, MIS capacitors, or any of a wide variety of other semiconductor devices. Alternatively, interconnect 2 may extend from a device to a bonding pad or the like. Interconnects 4a and 4b in some devices may be provided at adjacent locations horizontally displaced from interconnect 2.

Interconnects 2 and 4, which may be, for example metal, silicided polysilicon, heavily doped polysilicon, or other conductive materials, are formed on an oxide region, silicon nitride region, or other dielectric region 6, which may be, for example, the field oxide region between two adjacent devices. The field oxide region is generally a deposited or grown oxide on a substrate 8. Portions of the substrate 8 may be heavily doped below the field oxide with, for example, a p or n type dopant (not shown in FIG. 2). This heavily doped region serves as a channel stop between adjacent devices.

Optionally, an additional layer of oxide 10 is formed on the interconnects 2 and 4 above which an additional layer metal or other conductive material 12 is provided. The additional layer of metal 12 may also serve as an interconnection for the device.

The capacitance of the interconnect 2 is primarily a function of:

a) the capacitance of the interconnect to the substrate or ground due to the oxide ($C_g$) In the accumulation region of the MIS structure formed by the interconnect, the field oxide, and the substrate, this component of capacitance is, in the case of a metal-oxide-semiconductor (MOS) device, primarily a function of the thickness of the field oxide ($t_{ox}$), the width of the interconnect (W), the thickness of the interconnect ($t_c$), and the permittivity of the oxide ($\epsilon_{ox}$);

b) the capacitance of the interconnect to the adjacent interconnects ($C_{I1}$), which is primarily a function of the distance between leads (D), the thickness of the interconnect ($t_c$), and the permittivity of the oxide ($\epsilon_{ox}$); and c) the capacitance of the interconnect to other metal layers ($C_{I2}$), which is primarily a function of the thickness of the second oxide layer ($t_{ox2}$), the thickness of the interconnect, ($t_c$) and the permittivity of the oxide ($\epsilon_{ox}$).

In many devices, the capacitance of the interconnect to the substrate, $C_g$, plays a significant role in device performance. Accordingly, improvements in this capacitance value can result in significant improvements in overall device performance.

The invention herein provides for a lightly doped buried layer in the device, as shown in FIG. 2 in which similar features are provided with like reference numerals. The lightly doped buried layer 14 (referred to elsewhere herein as the LDBL) is provided below the oxide 6 and extends horizontally from the interconnect 2. The LDBL is lightly doped, preferably with a dopant material having a conductivity type opposite that of the substrate 8. In the example shown in FIGS. 1 and 2, the substrate is p-type and, accordingly, the LDBL is doped with an n-type material, most commonly arsenic or phosphorous, but, alternatively, other group V elements, group IV elements such as tin, silicon (when used as a substitute for gallium in gallium arsenide), and the like. In one embodiment, the LDBL is doped to a net concentration of below about $10^{14}/cm^3$ to $10^{15}/cm^3$. In a preferred embodiment the net dopant concentration in the LDBL is between about $10^{12}$ and $10^{14}/cm^3$ depending upon a variety of factors including the substrate doping concentration. In most preferred embodiments the LDBL has a net dopant concentration of about $10^{13}/cm^3$ with a substrate concentration of about $10^{15}$ to $10^{16}/cm^3$. Alternatively, the net dopant concentration of the LDBL usually will be less than the substrate by at least one order of magnitude and preferably between two and four orders of magnitude less than the substrate. In most embodiments, the thickness of the LDBL is restricted to less than or equal to the thickness of an adjacent p+ channel stop (not shown in FIG. 2) to assure contact of the buried layer with the substrate. In some embodiments the LDBL is between about 1 and 10 microns deep with depths of about 3 microns preferred.

Without wishing to be bound to any particular mode of operation, it is presently believed that due to the low carrier concentration in the LDBL, it will be depleted of majority carriers. Accordingly, a depletion region is created with an associated capacitance. This additional capacitance ($C_D$) will act in series with the oxide capacitance, $C_g$. The total capacitance of the two elements acting in series will be roughly inversely proportional to the sum of the reciprocals of the two capacitances. Accordingly, total capacitance is reduced through the addition of the LDBL capacitance. In addition, the junction capacitance adjacent bipolar transistors ($C_{js}$) will be reduced as well, leading to further improvements in the device operating speed. In MOS devices, tub-to-substrate capacitance will similarly be improved.

Without the LDBL, the total capacitance of the interconnect ($C_T$) in some devices will be about:

$$C_T = C_g = E_{ox}[1.15(W/T_{ox}) + 2.80(t_c/t_{ox})^{0.222}] \quad (1)$$

where:

$C_g$ is the oxide contribution to the total substrate to interconnect capacitance $C_T$;
$E_{ox}$ is the dielectric constant of the oxide;
$t_{ox}$ is the thickness of the oxide;

$t_c$ is the conductor thickness; and
W is the conductor width;

For a typical metal conductor using present production technology, $W=2$ μm, $t_c=0.9$ μm, and $t_{ox}$ is about 1 μm. Accordingly, C in a typical device will be about 0.17 fF/μm.

FIG. 2 illustrates the width of the depletion region created by the LDBL. For a typical device in which the LDBL is doped to $10^{13}/cm^3$ and the substrate is doped to $10^{16}/cm^3$, the width of the depletion region in the LDBL ($W_n$) will be more than 80 microns while the width of the depletion region in the substrate (Wp) will be about 0.8 microns. Accordingly, the depletion region will encompass essentially all of the LDBL up to reasonable depths of the buried layer. Therefore, when the LDBL is introduced into the device as shown in FIG. 2, and assuming a p-type substrate concentration of about $1\times 10^{15}/cm^3$ and an LDBL concentration of about $1\times 10^{13}/cm^3$, equation (1) can be amended approximately as follows:

$$C_T = E_{ox}[1.15(w/t') + 2.80(t_c/t')^{0.222}] \quad (2)$$

where:

$$t' = t_{ox} + (E_{ox}/E_{si})t_d;$$

$t_d$ = depletion width at the junction of the LDBL and substrate; and $E_{si}$ = dielectric constant of the silicon.

For a 3 μm LDBL, the equation (2) gives $C_g = 0.12$ fF/μm, which represents a 30% reduction in interconnection capacitance.

II. Application to a Bipolar Device

FIG. 3 illustrates an embodiment of the invention as it is applied to a device which includes a lateral npn bipolar transistor 16 and a resistor 18. It should be recognized that the invention is illustrated herein as it applies to a structure including a bipolar transistor and a resistor, but the invention is not so limited. The invention could be applied to the interconnect for a structure including any one of a wide variety of devices. For example, MIS transistors, p-n junction diodes, MIS capacitors, Schottky diodes, and combinations thereof are exemplary of devices which might be used in conjunction with the invention.

A substrate 8 is provided, which typically will be a p-type substrate having a dopant density of about $10^{16}/cm^3$. An n— doped LDBL 14 is provided in or adjacent the substrate and may be doped to, for example, about $10^{13}/cm^3$. In the embodiment shown in FIG. 3, LDBL 14 is about 2 microns in thickness and is formed by ion implantation into the substrate, epitaxial deposition, or other well known process. Channel stops 17a and 17b extend through the LDBL and into the substrate and, in the embodiment shown, are heavily doped with a p-type dopant.

The bipolar transistor 16 includes an n+ buried layer 19, which is doped to a well known concentration and serves as the collector and to decrease the resistance of the collector contact 26. P-type dopant, also at a well known concentration, is provided in region 20 and serves as the base of the bipolar transistor 16. A thick oxide region 10a, typically about 1 to 3 microns thick, is provided between the transistor 16 and an adjacent transistor or other device to the left of the transistor shown in FIG. 3. A thick oxide region 10b is provided between the base and collector of the transistor 16, and a thick oxide region 10c is provided between the collector of the bipolar transistor and adjacent devices to the right of the resistor shown in FIG. 3. Typically, regions 10a and 10c form a ring around the transistor, and region 10b isolates the collector contact from the transistor.

As shown in FIG. 3, the n— LDBL preferably encompasses as much of the integrated circuit as possible. In most preferred embodiments, the LDBL is provided across all of the substrate surface except those regions which act as a channel stop. The channel stops are preferably as small as possible while still providing effective device isolation. The channel stops are usually about 2 to 5 microns in width. Of course, some devices do not require isolation, and, therefore, the channel stops are not necessary to isolate such devices.

Above the oxide layer 10 a single layer of polysilicon may be used to form base contacts 22a and 22b, emitter contact 24, collector contact 26 resistor 18 on the surface of the device. The polysilicon 28 used to form the resistor is usually doped with a p-type dopant in an amount necessary to achieve the desired resistance. Another oxide layer 30 is provided above the single layer of polysilicon or other contact and appropriate contact holes are provided for the emitter, collector, and resistor. A metallization layer is provided above the second oxide layer and makes contact to the resistor 18 and transistor 16 and, further, provides interconnections 2, 4a, and 4b which may act as an interconnect to adjacent devices, bonding pads, or the like. By providing the LDBL below oxide under the interconnect, significant reduction in substrate/ interconnect capacitance can be achieved.

The transistor shown in FIG. 3 has the additional benefit of having reduced junction (collector to substrate) capacitance. The magnitude of the collector junction to substrate capacitance, $C_{js}$, effect on the delay depends on the specific type of device. In ECL circuits the contribution of $C_{js}$ to the gate-delay is particularly significant, especially at low current levels. In prior devices, the n+ buried layer in NPN transistor forms a pn function with the p-type substrate. Due to high dopant concentration in the buried-layer, the $C_{js}$ capacitance will be proportional to $1/SQRT(N_a)$, where $N_a$ is the substrate's doping concentration. The collector-substrate capacitance, $C_{js}$ can normally be reduced by using high resistivity substrates. Using a high resistivity substrate will, however, increase the resistance of ground-taps which is not normally desirable. Employing the LDBL is a valuable alternative which will not compromise the ground-tap performance.

Using an LDBL as shown in FIG. 3, a pn junction will be formed between p-type substrate and the lightly doped n-type LDBL. The depletion capacitance formed in this case will have a smaller value due to low concentration of LDBL. Note that a p-type LDBL can be used instead of n-type LDBL, even with a p-type substrate, leading to similar reduction in $C_{js}$. For the impurity profile shown in FIG. 4, analytical calculations indicate a reduction of more than 80% in $C_{jso}$ (which is the area, or floor, component $C_{js}$ at thermal equilibrium).

To estimate the LDBL effect on the periphery component of $C_{js}$, PISCES simulations were carried out. Plots of impurity concentration contours and depletion region for n+ to the p+ buried layers for a typical device are shown in FIG. 5.

For a spacing of 3.5 μm between the n+ and p+ buried layers, simulations show an improvement of about 16% in the periphery component of $C_{js}$. Therefore, about a 27% improvement in total $C_{js}$ for a 1.0 by 1.6 μm² buried layer could be provided in a typical device using today's process technology. For larger transistors, the relative reduction in $C_{js}$ will be even larger due to the reduction in periphery to area ratio. In processes with trench isolation the LDBL will also play a more significant role in reducing $C_{js}$ due to negligible periphery component.

III. Process Flow

FIGS. 6a to 6d illustrate one process which may be used to fabricate devices according to the invention herein. In FIG. 6a, a p-type substrate 8 is provided and an ion implantation using, for example, phosphorous, is performed using techniques readily known to those of skill in the art. The dose and energy of the implant, considering any later anneals of the implant, are adjusted in a preferred embodiment so that the n—region 18 is near intrinsic. In most preferred embodiments, the implant is adjusted so that the n—region 18 has a dopant concentration of between about $10^{12}$ and $10^{14}/cm^3$ and a depth of about 3 microns. In some embodiments, the implant shown in FIG. 6a is performed at an energy of about 180 KeV.

Thereafter, as shown in FIG. 6b, the device is provided with a suitable mask 32 which is used to define the channel stops 16. A boron implant is performed using an implant energy and time sufficient for the channel stops to extend at least up to the bottom of the LDBL, taking into account later anneals. In preferred embodiments, the p+ channel stop implant is performed using an implant energy of about 50 KeV. Diffusion from the LDBL as well as autodoping from adjacent p+ and n+ regions into the LDBL should be controlled by adjusting the temperature and pressure of the process.

After performing the p+ implant, the mask 32 is removed and a second mask 34 is deposited so as to define the n+ buried layer of a bipolar transistor. In preferred embodiments, the implant energy and time for formation of the n+ buried layer are adjusted so that the buried layer does not extend through the LDBL. In preferred embodiments, the implant for formation of the n+ buried layer is performed using an implant of As at 75 KeV. After forming the n+ buried layer, the mask 34 is removed and, using well known techniques, an n-type epitaxial layer is formed on the substrate. In preferred embodiments, the epitaxial layer is between about 0.8 and 2 microns thick.

Thereafter, processing continues in a manner which is known to those of skill in the art to form transistors, diodes, resistors, and other desired devices on the surface of the substrate. One possible method for forming MOS and bipolar transistors is disclosed in U.S. Pat. No. 4,764,480 (Vora), assigned to the assignee of the present invention and incorporated herein by reference for all purposes.

It should be recognized that the process shown in FIG. 6 is merely illustrative of those which could be utilized to form devices in accord with the invention herein. For example, the LDBL could be formed by deposition of a near intrinsic n-type or p-type epitaxial layer in which the buried layer and channel stops would be formed. When using epitaxial deposition, excessive diffusion from the substrate to the LDBL can be prevented by appropriate process temperature and pressure selection. Alternatively, the order of the process could be rearranged and, for example, a high energy implant could be used to form the LDBL after the buried layer and/or channel stops had been formed.

IV. Example 1

Device modeling was performed to demonstrate the efficacy of the invention. FIG. 7 shows the percentage improvement in interconnection-to-substrate (typically ground) capacitance for a variety of $t_{ox}$ and LDBL thicknesses. The LDBL thickness was assumed to be equal to the depletion width. For a typical process with a field oxide thickness of 1 μm, using a 2 μm LDBL leads to about a 20% improvement in capacitance, as compared to the case without LDBL.

In FIG. 8, percentage improvements in total capacitance for three metal leads are presented as a function of metal spacing. The improvement in total capacitance in this case is less than before. The contribution of the LDBL, however, can be still significant if LDBL thicknesses greater than 3 μm are used. One apparent advantage of using LDBL, as shown in FIG. 8, is that with increasing the LDBL thickness, the percentage variation in capacitance with metal spacing will increase. This is advantageous because it leads to better optimization of capacitance with metal pitch or spacing. This occurs because, as the LDBL thickness is increased, the total capacitance will be dominated by capacitance to adjacent leads. The total capacitance will, therefore, become sensitive to spacing.

In FIG. 9, the percentage reduction in total capacitance after LDBL application is plotted versus metal width, W. Using wider interconnections results in larger reductions in total capacitance because the contribution of the fringing capacitance, which is not affected by LDBL, is reduced.

V. Example 2

To study the effect of the LDBL on the wiring and bonding pad capacitance, large area (100 μm²×100 μm²) capacitors were fabricated on wafers with and without the LDBL. The LDBL was formed by depositing near intrinsic epitaxial layer on a 10 ohm-cm boron doped substrate. Channel stop (boron) and buried layer (arsenic) implants were then performed on some of the wafers to serve as a control. Standard bipolar processing was used to deposit a 0.5 ohm-cm epi layer, and form a 1.1 μm field oxide.

Boron autodoping during the reduced pressure epi growth employed for these experiments limited the LDBL thickness to approximately 1.5 μm. A wider LDBL layer could be formed by compensating the substrate with an implant/diffusion cycle, thereby capping the boron doped substrate. Wafers which received no intrinsic epi and no implants showed approximately a 10% reduction in capacitance over those which received the channel stop implant. The wafers which received the buried layer implant showed a 20%% reduction in capacitance and the wafers with the intrinsic epi showed a 30-40% reduction in capacitance.

VI. Example 3

An emitter coupled logic (ECL) gate was used to study the impact of the invention on wiring delay. For an unloaded gate, the LDBL will primarily reduce the collector-to-substrate capacitance. To study the LDBL effect on a loaded gate delay, a realistic picture of the interconnection routing must be provided. The wiring loading effect on a "typical" gate in general will include a combination of all interconnection layers and is product dependent. This complication was avoided herein by considering several simpler cases. These cases include an unloaded gate, and a gate loaded with 100 μm of a single wire parallel with two grounded adjacent leads. Simulations were carried out for the different thicknesses of LDBL. For the unloaded ECL gate operating at a 100 μA of switching current using a 2 μm LDBL, an improvement in gate-delay of 7.5% was obtained, reflecting a 27% reduction in $C_{jso}$. Results of the wiring-delay simulations for 100 μm of interconnection loading are presented in FIGS. 10 and 11. Depending on the routing scheme and the LDBL thickness, the delay associated with the interconnection can be improved in some embodiments from 8% to more than 22% for ECL drivers operating at low switching currents.

It is to be understood that the above description is intended to be illustrative and not restrictive. By way of example the invention herein could readily be applied in combination with other methods of reducing interconnection capacitance. By way of further example, devices have been used for illustration herein which provide particular doping profiles and particular dopants, but these doping profiles could readily be modified and the role of n- and p-type dopants could be reversed. Also, while the invention has been described primarily with regard to silicon devices, the invention will also find application in gallium arsenide, germanium, and gallium phosphide devices. By way of further example, the invention could be applied to the interconnects of a wide variety of devices such as resistors, diodes (both pn junctions and MIS type), transistors (both bipolar and MIS), Schottky barrier diodes, MIS capacitors, charge-coupled devices, and combinations thereof. The scope of the invention should, therefore, be determined not with reference to the above description, but should instead be determined with reference to the appended claims, along with the full scope of equivalents to which such claims are entitled.

What is claimed is:

1. A semiconductor structure comprising:
   a) a substrate having a major surface, said substrate having a first conductivity type;
   b) a lightly doped region along at least a portion of said major surface, said lightly doped region having a dopant concentration less than said substrate;
   c) a dielectric region adjacent said lightly doped region, said dielectric region extending from a first device on said substrate to a bonding pad; and
   d) a conductive interconnect region on said dielectric region, said conductive interconnect region connecting said first device and said bonding pad, said lightly doped region extending under said conductive interconnect region for substantially all its length from said first device to said bonding pad.

2. A semiconductor structure comprising:
   a) a substrate having a major surface, said substrate having a first conductivity type;
   b) a lightly doped region along at least a portion of said major surface, said lightly doped region having a dopant concentration less than said substrate;
   c) a dielectric region adjacent said lightly doped region, said dielectric region extending from a first device on said substrate to a transistor; and
   d) a conductive interconnect region on said dielectric region, said conductive interconnect region connecting said first device and said transistor, said lightly doped region extending under said conductive interconnect region for substantially all its length from said first device to said transistor.

3. The structure as recited in claim 1 or claim 2 wherein said lightly doped region is of an opposite conductivity type.

4. The structure as recited in claim 3 wherein said first conductivity type is p-type and said opposite conductivity type is n-type.

5. A semiconductor structure as recited in claim 1 or claim 2 wherein said first device is selected from the group bipolar transistors, MIS transistors, p-n diodes, Schottky diodes, MIS capacitors, interconnects, and resistors.

6. The structure as recited in claim 1 or claim 2 wherein said conductive region is selected from the group metal, heavily doped polysilicon, and metal silicide.

7. The structure as recited in claim 1 or claim 2 wherein said first device is bounded by a channel stop, said channel stop comprising a heavily doped region of said first conductivity type.

8. The structure as recited in claim 7 wherein said channel stop extends through said lightly), doped region and into said substrate.

9. The structure as recited in claim 1 or claim 2 wherein said lightly doped region has a dopant concentration of less than about $10^{14}/cm^3$.

10. The structure as recited in claim 1 or claim 2 wherein said lightly doped region has a dopant concentration more than one order of magnitude less than said substrate.

11. The structure as recited in claim 1 or claim 2 wherein said lightly doped region has a dopant concentration of between two and four orders of magnitude less than said substrate.

12. The structure as recited in claim 1 or claim 2 wherein said lightly doped region has a dopant concentration of between about $10^{12}$ and $10^{14}/cm^3$.

13. The structure as recited in claim 1 or claim 2 wherein said lightly doped region has a dopant concentration of about $10^{13}/cm^3$.

14. The structure as recited in claim 1 or claim 2 wherein said first device is a bipolar transistor and wherein said lightly doped region extends under said bipolar transistor.

15. The structure as recited in claim 14 wherein said lightly doped region is of an opposite conductivity type, and wherein said bipolar transistor comprises a heavily doped buried layer, said heavily doped buried layer being of said opposite conductivity type and extending partially through said lightly doped region of opposite conductivity type.

* * * * *